United States Patent
Lee et al.

(10) Patent No.: US 12,144,109 B2
(45) Date of Patent: Nov. 12, 2024

(54) PRINTED CIRCUIT BOARD WITH INCREASED DURABILITY IN BENDING REGION AND ELECTRONIC DEVICE INCLUDING SAME

(71) Applicant: SAMSUNG ELECTRONICS CO., LTD., Suwon-si (KR)

(72) Inventors: Youngsun Lee, Suwon-si (KR); Sungwon Park, Suwon-si (KR); Eunseok Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 206 days.

(21) Appl. No.: 17/967,532

(22) Filed: Oct. 17, 2022

(65) Prior Publication Data
US 2023/0119129 A1   Apr. 20, 2023

Related U.S. Application Data

(63) Continuation of application No. PCT/KR2022/014444, filed on Sep. 27, 2022.

(30) Foreign Application Priority Data

Oct. 20, 2021   (KR) .................. 10-2021-0139886
Nov. 16, 2021   (KR) .................. 10-2021-0157679

(51) Int. Cl.
*H05K 1/02*   (2006.01)
*H05K 1/11*   (2006.01)
*H05K 1/14*   (2006.01)

(52) U.S. Cl.
CPC .......... *H05K 1/0283* (2013.01); *H05K 1/115* (2013.01); *H05K 1/147* (2013.01); *H05K 2201/098* (2013.01)

(58) Field of Classification Search
CPC ...... H05K 1/0283; H05K 1/115; H05K 1/147; H05K 2201/098; H05K 2201/09827; H05K 1/028
See application file for complete search history.

(56) References Cited

U.S. PATENT DOCUMENTS 8,119,924 B2   2/2012   Abe et al.
8,913,398 B2   12/2014   Watanabe et al.
(Continued)

FOREIGN PATENT DOCUMENTS

KR   10-0530749   11/2005
KR   10-2009-0060479   6/2009
(Continued)

OTHER PUBLICATIONS

Search Report and Written Opinion dated Jan. 2, 2023 issued in International Patent Application No. PCT/KR2022/014444.

*Primary Examiner* — Sherman Ng
(74) *Attorney, Agent, or Firm* — Nixon & Vanderhye, P.C.

(57) ABSTRACT

A printed circuit board is provided. The printed circuit board includes: an extending region extending along one direction, and a bending region configured to bend with respect to the extending region. The extending region and the bending region includes a non-conductive layer, a first conductive layer disposed on one surface of the non-conductive layer, a second conductive layer disposed on the other surface of the non-conductive layer, and at least one via hole penetrating the non-conductive layer, the first conductive layer, and the second conductive layer. In the bending region, a cross-sectional area of the via hole in contact with the first conductive layer is less than a cross-sectional area of the via hole in contact with the second conductive layer.

20 Claims, 12 Drawing Sheets

(56) References Cited

U.S. PATENT DOCUMENTS

| | | |
|---|---|---|
| 9,195,108 B2 | 11/2015 | Park et al. |
| 11,266,016 B2 | 3/2022 | Kamitsubo et al. |
| 11,450,949 B2 | 9/2022 | Yun et al. |
| 2006/0076160 A1 | 4/2006 | Hsu et al. |
| 2020/0006397 A1* | 1/2020 | Park .................... H01L 27/1244 |
| 2021/0083020 A1* | 3/2021 | Zhou ..................... H10K 59/12 |
| 2021/0212201 A1* | 7/2021 | Hwang ................ H05K 3/0014 |
| 2022/0011637 A1* | 1/2022 | Yin ..................... G02F 1/13452 |

FOREIGN PATENT DOCUMENTS

| | | |
|---|---|---|
| KR | 10-1092987 | 12/2011 |
| KR | 10-2020-0007377 | 1/2020 |
| KR | 10-2020-0087511 | 7/2020 |
| WO | 2020/122180 | 6/2020 |

* cited by examiner

PRINTED CIRCUIT BOARD WITH INCREASED DURABILITY IN BENDING REGION AND ELECTRONIC DEVICE INCLUDING SAME

CROSS-REFERENCE TO RELATED APPLICATIONS

This application is a continuation of International Application No. PCT/KR2022/014444, designating the United States, filed on Sep. 27, 2022, in the Korean Intellectual Property Receiving Office and claiming priority to Korean Patent Application No. 10-2021-0139886, filed on Oct. 20, 2021, in the Korean Intellectual Property Office, and to Korean Patent Application No. 10-2021-0157679, filed on Nov. 16, 2021, in the Korean Intellectual Property Office, the disclosures of all of which are incorporated by reference herein in their entireties.

BACKGROUND

Field

The disclosure relates to a printed circuit board with increased durability in a bending region and an electronic device including the same.

Description of Related Art

As electronic devices are designed to perform various functions according to users' requests, the electronic devices may include a multiplicity of printed circuit boards (PCBs). A multiplicity of electronic components of an electronic device may be arranged on a same printed circuit board or on different printed circuit boards, thereby forming internal electrical connections in the electronic device.

Along with miniaturization of those electronic devices, a printed circuit board may be mounted in a partially bending structure within an electronic device to secure a mounting space enough to accommodate various electronic components.

A printed circuit board may include at least one conductive via that is configured to electrically connect different conductive layers, and some of the printed circuit board may be bent. In case where a portion of the printed circuit board is configured to bend, stress may result in the bending portion of the printed circuit board. When a conductive via is included in the bending portion of the printed circuit board, the stress caused by bending of the printed circuit board may be concentrated in a region right adjacent to the via. When such stress gets concentrated in a certain area of the printed circuit board, cracks may occur in the printed circuit board. When such a crack occurs, electrical connections in between various electronic components making up the electronic device may be significantly damaged, and thus the electronic device may be unable to secure an expected lifespan.

The technical problems to be achieved by the teachings of this disclosure are not limited to those described above, and other technical problems not mentioned herein will be clearly understood to those having ordinary knowledge in the art to which the disclosure belongs, from the following description.

SUMMARY

Embodiments of the disclosure provide a printed circuit board having increased durability in its bending region and an electronic device including the same.

In accordance with an example embodiment of the disclosure, a printed circuit board is provided, the printed circuit board comprising: an extending region extending along one direction, and a bending region configured to bend with respect to the extending region, wherein the extending region and the bending region comprise: a non-conductive layer, a first conductive layer disposed on one surface of the non-conductive layer, a second conductive layer disposed on another surface of the non-conductive layer, and at least one via hole penetrating the non-conductive layer, the first conductive layer, and the second conductive layer. In the bending region, a cross-sectional area of the via hole in contact with the first conductive layer may be less than a cross-sectional area of the via hole in contact with the second conductive layer.

In accordance with another example embodiment of the disclosure, an electronic device is provided, the electronic device comprising: a first printed circuit board, and a second printed circuit board comprising an extending region electrically connected to the first printed circuit board and a bending region configured to bend with respect to the extending region, wherein the extending region and the bending region comprise: a non-conductive layer, a first conductive layer disposed on one surface of the non-conductive layer, a second conductive layer disposed on the other surface of the non-conductive layer, and at least one via hole penetrating the non-conductive layer, the first conductive layer, and the second conductive layer. In the bending region, a cross-sectional area of the via hole in contact with the first conductive layer may be less than a cross-sectional area of the via hole in contact with the second conductive layer.

In accordance with an example embodiment of the disclosure, a printed circuit board is provided, the printed circuit board comprising: a first coverlay, a first adhesive layer disposed on the first coverlay, a first conductive layer disposed on the first adhesive layer, a non-conductive layer disposed on the first conductive layer, a second conductive layer disposed on the non-conductive layer, a second adhesive layer disposed on the second conductive layer, a second coverlay disposed on the second adhesive layer, and a plurality of via holes penetrating the first conductive layer, the non-conductive layer, and the second conductive layer. A cross-sectional area of a region of the via hole disposed in a bending region in contact with the first conductive layer among the plurality of via holes may be different from a cross-sectional area of a region of the via hole disposed in the bending region in contact with the second conductive layer.

The printed circuit board according to various example embodiments makes it possible for the via holes in its bending region to have different cross-sectional areas in between conductive layers, thereby having the stress caused by bending of the printed circuit board effectively dispersed. Therefore, a bending region of the printed circuit board according to various embodiments can provide increased durability, thereby leading to its prolonged lifespan. The electronic device according to various embodiments includes a printed circuit board having increased durability in its bending region, thereby securing an expected lifespan and seamlessly providing its users with an originally designed function without a malfunction.

The effects that can be obtained from the present disclosure are not limited to those described above, and any other effects not mentioned herein will be clearly understood to those having ordinary knowledge in the art to which the disclosure belongs, from the following description.

BRIEF DESCRIPTION OF THE DRAWINGS

The above and other aspects, features, and advantages of certain embodiments of the present disclosure will be more apparent from the following detailed description, taken in conjunction with the accompanying, in which.

DETAILED DESCRIPTION

Figure 1:
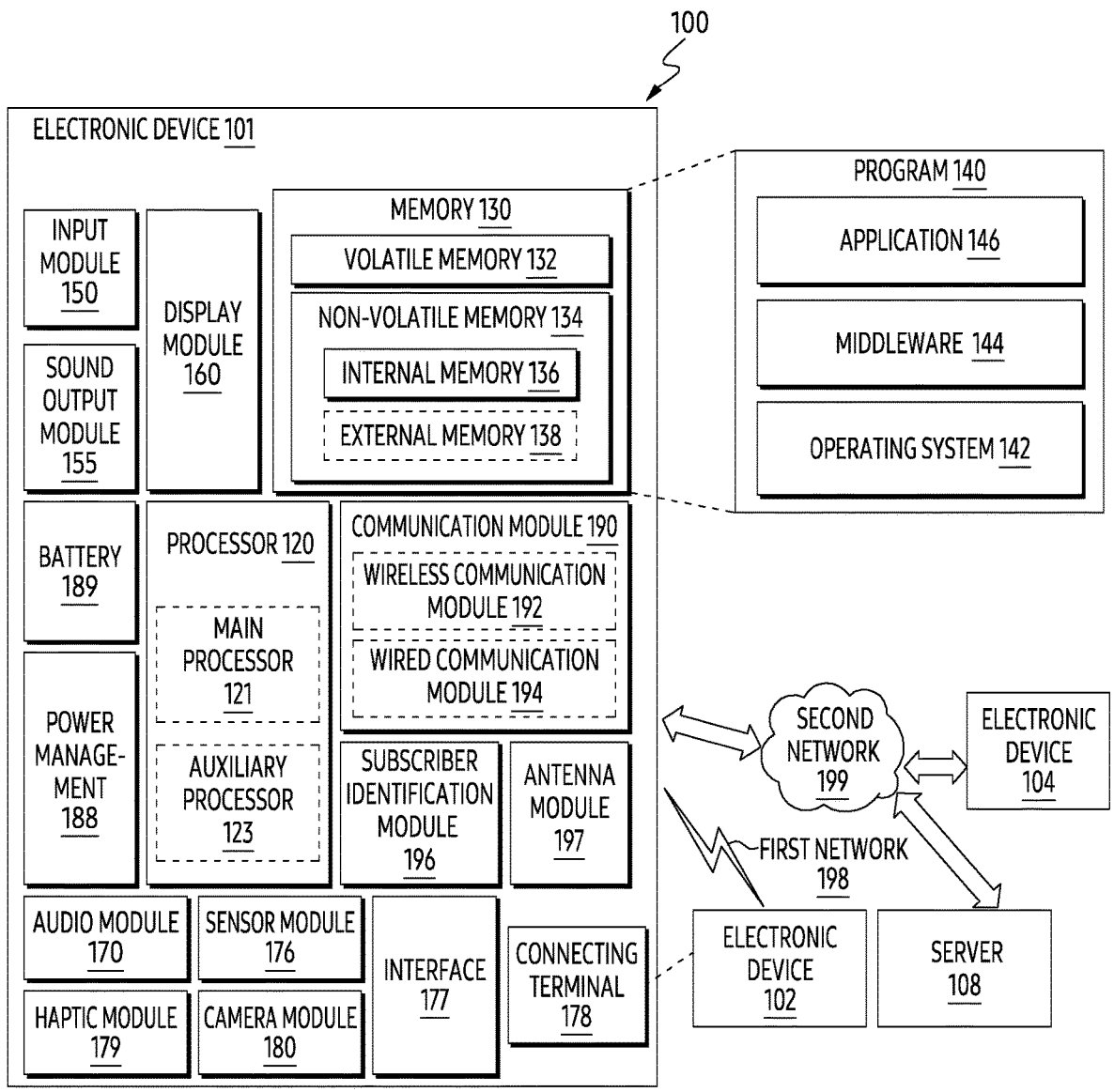
FIG. 1 is a block diagram illustrating an example electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in a volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
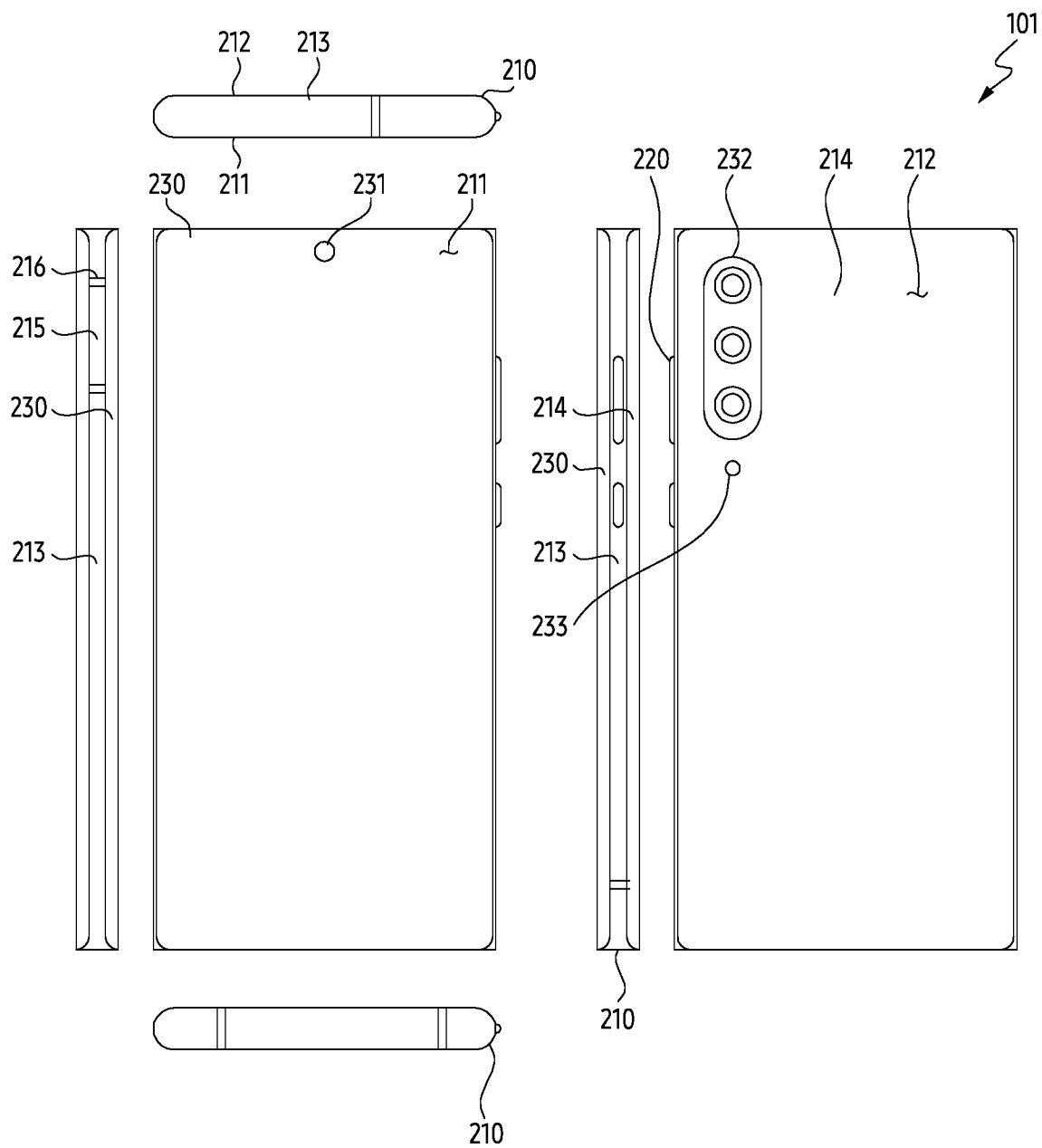
FIG. 2A is a diagram illustrating an external appearance of an electronic device according to an embodiment.
Figure 2B:
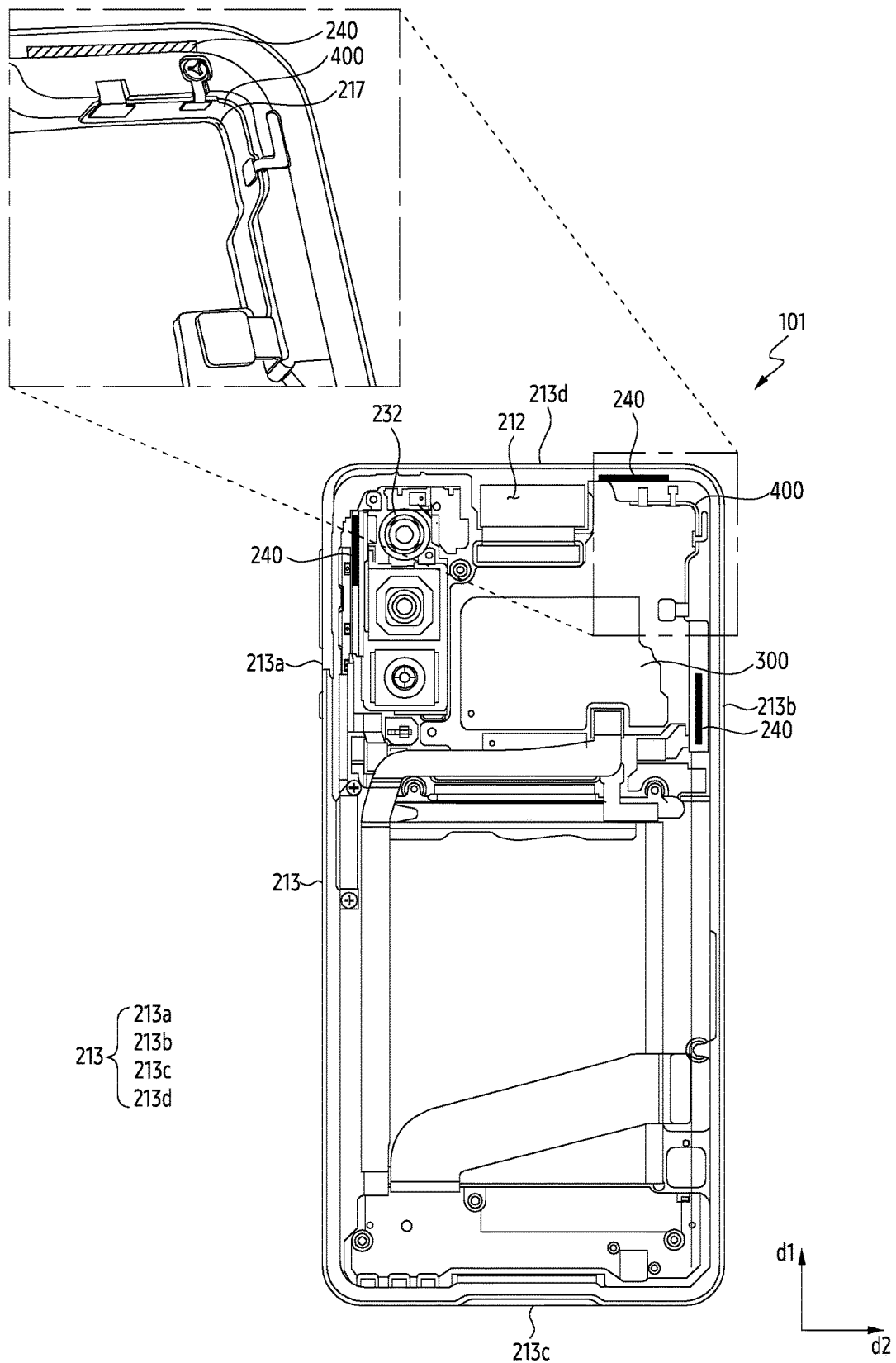
FIG. 2B is a diagram illustrating a second surface of an electronic device in a state in which its cover plate is removed, according to an embodiment.

FIG. 2A is a diagram illustrating an external appearance of an electronic device according to an embodiment, and FIG. 2B is a diagram illustrating a second surface of the electronic device in a state in which its cover plate is removed, according to an embodiment.

Referring now to FIGS. 2A and 2B, the electronic device 101 according to an embodiment may include a housing 210 and at least one key button 220.

According to an embodiment, the housing 210 may include an outermost surface of the electronic device 101 that comes into contact with a user's hand when the user grips the electronic device 101. The housing 210 may form an internal space in which various components of the electronic device 101 are disposed. According to an embodiment, the housing 210 includes a first surface 211 on which a display 230 is disposed, a second surface 212 facing the first surface 211, and a side surface 213 formed along at least a portion of edges of the first surface 211 and the second surface 211. According to an embodiment, the first surface 211 and the second surface 212 may be spaced apart from each other, facing each other, and the side surface 213 may extend along at least a portion of the edges of the first surface 211 and the second surface 212 between the first surface 211 and the second surface 212, so as to form an internal space.

According to an embodiment, the first surface 211 may be formed of a front plate, at least a portion of which is substantially transparent. The front plate formed on the first surface 211 may be configured to transmit visual information provided via the display 230 to the outside. The first surface 211 may include a glass plate or a polymer plate having various layers.

According to an embodiment, the second surface 212 may be formed of a substantially opaque cover plate 214. The cover plate 214 may be formed of coated or colored glass, ceramic, polymer, or a combination of at least two of these materials.

According to an embodiment, the side surface 213 may include a first side surface 213a extending in a first direction d1, a second side surface 213b spaced apart from the first side surface 213a and extending in the first direction d1 to be substantially with the first side surface 213a, a third side surface 213c extending from one end of the first side surface 213a to the second side surface 213b along a second direction d2 substantially perpendicular to the first direction d1, and a fourth side surface 213d extending from the other end of the first side surface 213a to the other end of the second side surface 213b along the second direction d2. For example, the first side surface 213a and the second side surface 213*b* may be configured to extend longer than the third side surface 213*c* and the fourth side surface 213*d* so that the electronic device 101 has a certain length. Therefore, the first side surface 213*a*, the second side surface 213*b*, the third side surface 213*c*, and the fourth side surface 213*d* may form an internal space for accommodating various components of the electronic device 101, together with the first side surface 211 and the second side surface 212.

According to an embodiment, the side surface 213 may include a conductive material or a non-conductive material. For example, the side surface 213 may include a conductive member 215 or a non-conductive member 216. The side surface 213 may include a plurality of conductive members 215 or non-conductive members 216, and each of the plurality of conductive members 215 or each of the non-conductive members 216 may be configured to be spaced apart from each other.

According to an embodiment, at least one key button 220 may be disposed inside the housing 210, and its portion may be exposed to the side surface 213. For example, a portion of the at least one key button 220 may be exposed to the side surface 213 of the electronic device 101 through an opening formed in the side surface 213. When the at least one key button 220 is depressed by the user, the electronic device 101 may perform a designated function in response to depressing of the at least one key button 220. The electronic device 101 may include a plurality of key buttons 220, and each key button 220 may be associated with a different function. For example, in response to depressing of at least one key button 220, the electronic device 101 may perform a power on/off function of the electronic device 101, a wake-up/sleep function, a volume control function of a speaker, and so on. The at least one key button 220 may be disposed at a position corresponding to a user's finger when the user grips the electronic device 101 with one hand. For example, the key button 220 may be disposed on the left and/or right side of the housing 210, which corresponds to a position corresponding to a user's thumb or index finger.

According to an embodiment, the display 230 may be disposed on the first surface 211 of the housing 210. The display 230 may be configured to display visual information to the outside. The electronic device 101 may include a front camera module 231 on the first surface 211 on which the display 230 is disposed. The display 230 may include a front camera module 231 arranged in alignment with a recess or an opening formed in a certain part of a screen display area of the display 230. According to an embodiment, the front camera module 231 may be positioned underneath the display 230, so that at least a part thereof may be covered by the display 230. For example, the front camera module 231 may be disposed underneath the display 230 in an under display camera (UDC) scheme.

According to an embodiment, at least parts of a rear camera module 232, which distinct from the front camera module 231, and a flash 233 may be exposed through an opening formed in the second surface 212. A user of the electronic device 101 may take a picture and/or a video using the front camera module 231 and/or the rear camera module 232, incorporated in the electronic device 101. The rear camera module 232 may have multiple cameras with different functions. For example, the rear camera module 232 may include at least one of a depth camera, a wide-angle camera, an ultra-wide-angle camera, a telephoto-lens camera or the like.

According to an embodiment, a flash 233 may serve to enhance light emitted or reflected from a subject for photographing in a low-illuminance environment. The flash 233 may be configured to emit light toward the subject in order to enhance light emitted or reflected from the subject using one or more light emitting diodes.

According to an embodiment, the electronic device 101 may further include an antenna array 240, a first printed circuit board 300, and a second printed circuit board 400.

According to an embodiment, the antenna array 240 may transmit signals to the outside of the electronic device 101 or receive signals from the outside of the electronic device 101. The antenna array 240 may include the aforementioned antenna module (e.g., an antenna module 197 of FIG. 1). According to an embodiment, the antenna array 240 may include a plurality of antenna elements arranged to form a directional beam. For example, the plurality of antenna elements may include a plurality of antenna arrays (e.g., a dipole antenna array and/or a patch antenna array) of the same or different shapes and types. The plurality of antenna elements may be disposed at different positions to increase coverage of signals radiated from the antenna arrays 240.

According to an embodiment, the antenna array 240 may be disposed adjacent to the side surface 213 to transmit or receive a signal to/from the outside of the electronic device 101 through at least a portion of the side surface 213. For example, the antenna array 240 may be disposed inside the electronic device 101 to be adjacent to at least one of the first side surface 213*a*, the second side surface 213*b*, and the fourth side surface 213*d*.

According to an embodiment, the first printed circuit board 300 may be configured to establish electrical connections between various components of the electronic device 101 to perform the overall operation of the electronic device 101. For example, the first printed circuit board 300 may be a main circuit board of the electronic device 101 on which a processor (e.g., a processor 120 of FIG. 1) is disposed. According to an embodiment, the first printed circuit board 300 may be configured to establish electrical connections between various components arranged on the first printed circuit board 300 or various electronic elements of the electronic device 101 arranged out of the first printed circuit board 300. The first printed circuit board 300 may be electrically connected to various components of the electronic device 101 through at least one connecting member. For example, the connecting member may include a coaxial cable connector, a board-to-board connector, an interposer, or a flexible printed circuit board (FPCB). According to an embodiment, the first printed circuit board 300 may be formed based on a PPG (PREPREG, preimpregnated materials) substrate. For example, the first printed circuit board 300 may be manufactured to include epoxy (FR-4, FR-5, G-2, G-11) material. The first printed circuit board 300 formed based on a PPG substrate may have rigidity without substantially having elasticity.

According to an embodiment, the second printed circuit board 400 may receive a signal related to power supply or a signal related to data transmission from the first printed circuit board 300, or transmit the same to the first printed circuit board 300. The second printed circuit board 400 may be configured to establish electrical connections with the first printed circuit board 300. For example, the second printed circuit board 400 may be configured to mount the antenna array 240 therein to make up an antenna module 197, or mount other components of the electronic device 101 distinguished from the antenna array 240.

According to an embodiment, at least one area of the second printed circuit board 400 may be bent. For example, the second printed circuit board 400 may be bent using plastic deformation or elastic deformation. Here, the plastic deformation may denote that once an external force is applied to deform a second printed circuit board 400 into a certain shape, the second printed circuit board 400 maintains the shape even after the applied force is removed. For example, the second printed circuit board 400 may include a plastically deformable material and may be plastically deformed by application of a stress in a preset range. Further, the elastic deformation may denote that once a force is applied to deform the second printed circuit board 400 into a certain shape, it then returns to its original shape right after the applied force is removed. As at least one area of the second printed circuit board 400 is configured to be bent, the second printed circuit board 400 may be fittingly mounted onto various spaces within the electronic device 101.

According to an embodiment, the second printed circuit board 400 may be accommodated in an accommodation space 217 formed to be partially bent. For example, the accommodating space 217 may have a shape that extends along the first direction d1 and is partially curved along the second direction d2. At least a portion of the second printed circuit board 400 may have a shape corresponding to the partially bent accommodation space 217 and be accommodated in the accommodation space 217.

As described above, the electronic device 101 according to an embodiment makes it possible to achieve a more efficient mounting space owing to accommodation of the second printed circuit board 400 in various spaces inside the electronic device 101. For example, when the second printed circuit board 400 does not have a curved or bending shape, the mounting space of the electronic device 101 may be significantly limited as the electronic device 101 is miniaturized, so that there may be considerable restriction on accommodation of the second printed circuit board 400 in the mounting space of the electronic device 101. According to an embodiment, the second printed circuit board 400 of the electronic device 101 can be designed to have a curved or bending shape and thus, it can be well accommodated in various accommodation space such as an internal space 217, thereby making it possible to efficiently utilize and save a mounting space within the electronic device 101.

Figure 3:
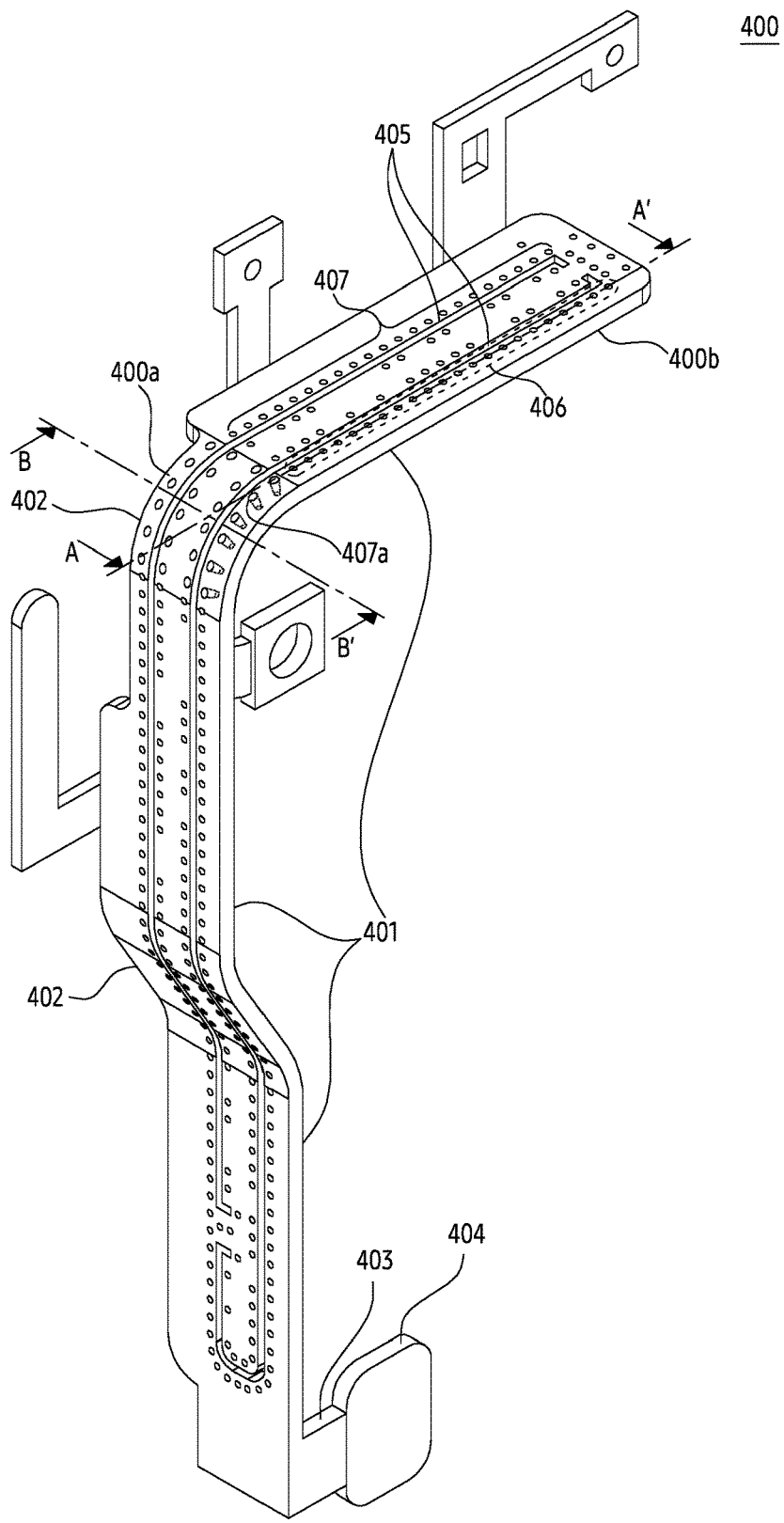
FIG. 3 is a perspective view of a second printed circuit board according to an embodiment.

FIG. 3 is a perspective view of a second printed circuit board according to an embodiment.

Referring to FIG. 3, in an embodiment, the second printed circuit board 400 may include at least one extending region 401, at least one bending region 402, a flexible region 403, a connector 404, at least one signal line 405, a ground line 406, and a plurality of via holes 407. According to an embodiment, the second printed circuit board 400 may be of a flexible printed circuit board in which a plastically deformable material is added to a portion of a common flexible printed circuit board.

The extending region 401 may extend in one direction. According to an embodiment, the extending region 401 has substantially no curvature and extends in a straight line. According to an embodiment, at least one component (not shown) may be disposed in the extending region 401, wherein the at least one component may include a connector, a switch, a resistor, a capacitor, an inductor, a diode, and a transistor, an integrated circuit, an antenna, a speaker, piezoelectric elements, clips, and/or brackets. According to an embodiment, the extending region 401 may include at least one layer in which a plastically deformable material is stacked, so that it can provide good plastically-deformable properties.

The bending region 402 may be formed to be bent with a certain curvature. For example, the bending region 402 may be bent with a different curvature at each point of circumferential section of the bending region 402 or with the same curvature at each point of circumferential section of the bending region 402. According to an embodiment, the bending region 402 may include a plastically deformable material. The plastically deformable material may be a material of characteristic that is elastically deformed in a section having an elongation of 10% or less and plastically deformed in a section having an elongation of 10% to 80%. The plastically deformable material may have a Young's modulus of 15 MPa or less in a section in which an elongation is 10% to 80%. According to an embodiment, the plastically deformable material may be a material having the property that fracture occurs in a section in which the elongation is 80% or more. According to an embodiment, the second printed circuit board 400 may include a plurality of conductive layers (e.g., a first conductive layer 430 and a second conductive layer 450 of FIGS. 4A and 4B). For example, the second printed circuit board 400 may have a four-layer structure including four conductive layers (e.g., flexible copper clad laminate (FCCL)), a three-layer structure including three conductive layers, or a two-layer structure (for example, refer to the second printed circuit board 400 of FIGS. 4A and 4B) including two conductive layers.

Figure 4A:
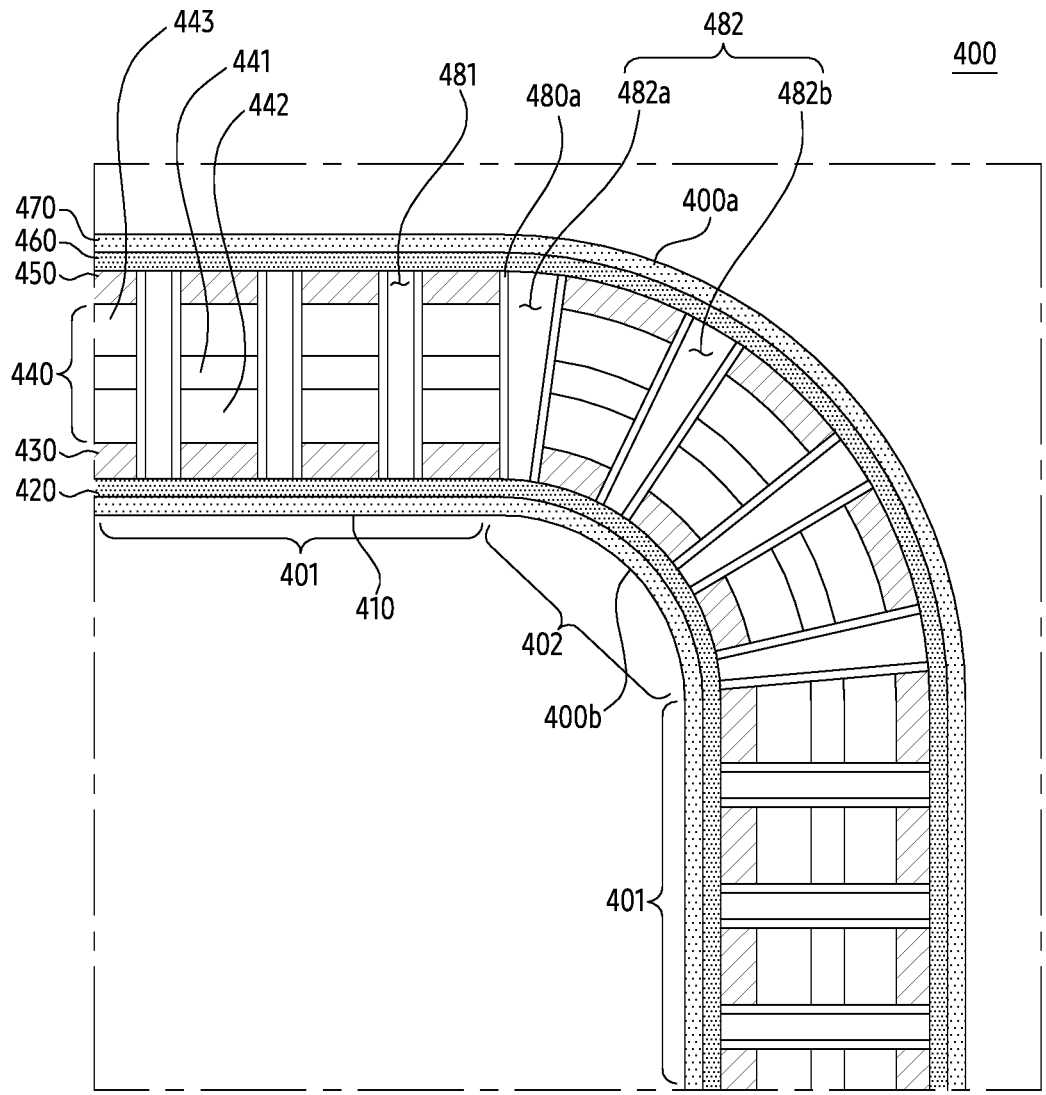
FIG. 4A is a cross-sectional view illustrating at least a portion of an example structure taken along line A-A' of FIG. 3 of an extending region and a bending region of a second printed circuit board according to an embodiment.
Figure 4A:
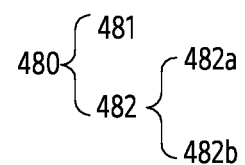
Figure 4B:
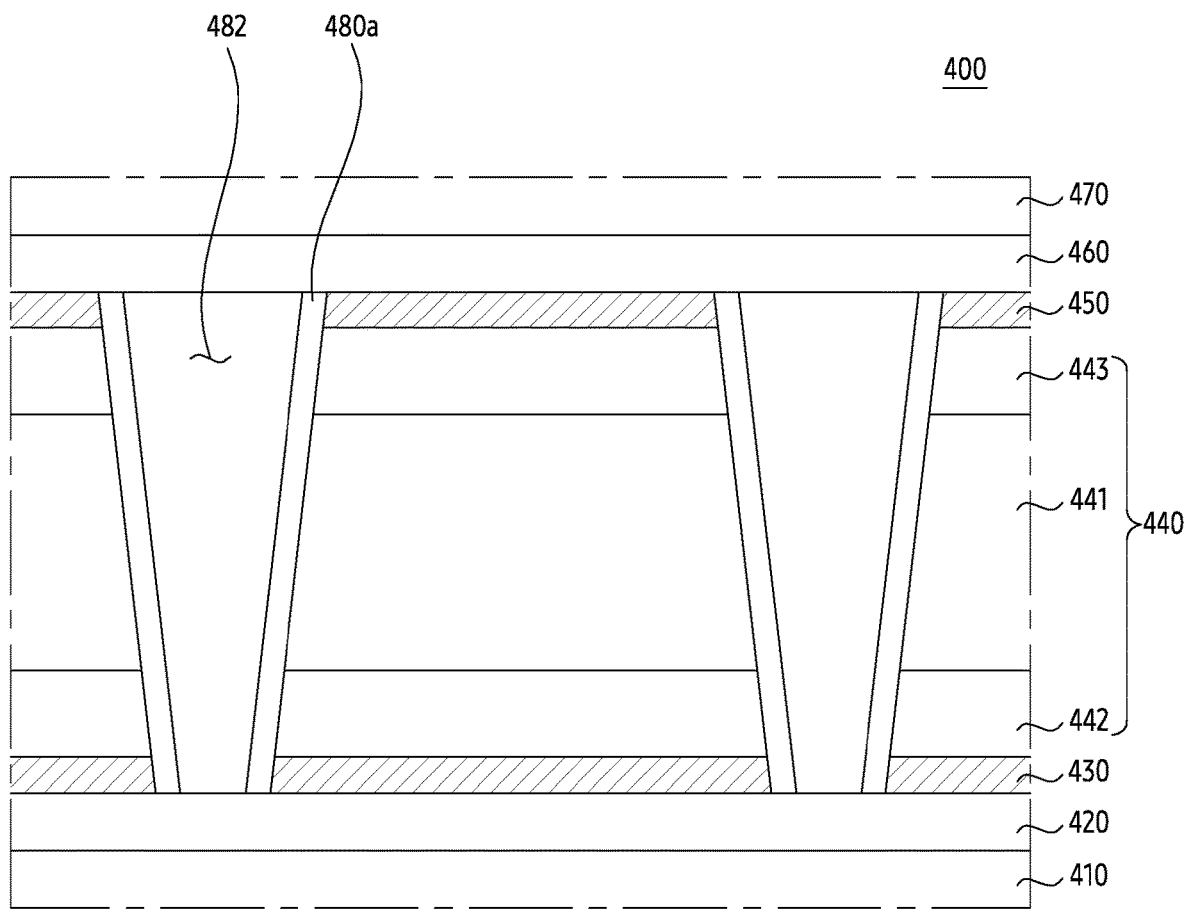
FIG. 4B is a cross-sectional view illustrating at least a portion of an example structure taken along line B-B' of FIG. 3 of a bending region of a second printed circuit board according to an embodiment.

According to an embodiment, when the second printed circuit board 400 is formed in a structure having a plurality of conductive layers, the second printed circuit board 400 may include a plurality of plastically deformable materials (e.g., a coupling layer 441 of FIG. 4B, or a bonding sheet). For example, when the second printed circuit board 400 is formed in a four-layer structure having four conductive layers, the second printed circuit board 400 may include a plurality of plastically deformable materials disposed in at least one of between the first conductive layer and the second conductive layer, between the second conductive layer and the third conductive layer, and between the third conductive layer and the fourth conductive layer. As another example, when the second printed circuit board 400 is formed in a three-layer structure having three conductive layers, the second printed circuit board 400 may include a plastically deformable materials between the first conductive layer and the second conductive layer, and may include an insulating layer made of a polyimide material (e.g., a first insulating layer 442 or a second insulating layers 443 of FIG. 4B) between the second conductive layer and the third conductive layer.

In an embodiment, the plastically deformable material may be made of a polymer material including at least one of acrylic, epoxy, and/or nitrile-butadiene rubber.

According to an embodiment, the bending region 402 may be formed by plastically deforming the extending region 401 under a predetermined range of stress. For example, the bending region 402 and the extending region 401 may be made of the same material. The bending region 402 may be formed by plastically deforming a portion of the extending region 401 made of the same material under stress. According to an embodiment, the bending region 402 may be transformed by a worker (or an automatic assembly machine) assembling an electronic device, before assembling it into an internal space in which various components of the electronic device (e.g., an electronic device 101 of FIGS. 1, 2A and 2B) are mounted. For example, the bending region 402 may be bent in advance before being disposed into the electronic device 101, so that it fittingly corresponds to a bent or curved section in the internal space of the electronic device 101.

The flexible region 403 may refer to a portion of the second printed circuit board 400 that may be elastically deformed. For example, unlike the extending region 401 and the bending region 402, the flexible region 403 may not have any plastically deformable material to prevent and/or reduce plastic deformation. According to an embodiment, no plastically deformable material is laminated on the flexible region 403, and a shielding film (e.g., electro-magnetic interference (EMI) film) or an air gap may be then formed on the same layer (e.g., a coupling layer 441 of FIG. 4B) as the plastically deformable material.

The connector 404 may electrically connect the second printed circuit board 400 with another printed circuit board distinct from the second printed circuit board 400 (e.g., a first printed circuit board 300 of FIG. 2B). The connector 404 may be connected to the flexible region 403. For example, the connector 404 may be a plug connector in a board-to-board (btob) connector.

A signal line 405 may be a travelling path of a signal transmitted from the second printed circuit board 400 or a signal received from the first printed circuit board 300. The signal line 405 may be formed along the extending region 401 and the bending region 402. For example, the signal line 405 may be made of a metal material, but is not limited thereto.

A ground line 406 may serve to shield unnecessary electromagnetic waves transmitted to the signal line 405 to facilitate signal transmission in the signal line 405. According to an embodiment, the ground line 406 may be configured to be spaced apart from the signal line 405 and extend along an edge of the signal line 405.

A plurality of via-holes 407 may be formed along the ground line 406. The plurality of via holes 407 may serve to shield unnecessary electromagnetic waves transmitted to the signal line 405 or form a kind of via fence to prevent and/or reduce such electromagnetic waves from leaking from the signal line 405. According to an embodiment, the plurality of via holes 407 may be formed in the extending region 401 and the bending region 402 along the ground line 406.

According to an embodiment, the cross-sectional areas of the via hole 407a formed in the bending region 402 of the plurality of via holes 407 may be different from each other in between one surface 400a and the other surface 400b of the second printed circuit board 400. For example, for the via holes 407a formed in the bending region 402, a cross-sectional area closer to one surface 400a of the second printed circuit board 400 may be greater than the cross-sectional area closer to the other surface 400b of the second printed circuit board 400. A curvature of the bending region 402 on one surface 400a of the second printed circuit board 400 may be less than a curvature on the other surface 400b. According to the difference in curvature between one surface 400a and the other surface 400b, a tensile force may be applied onto one area of the via hole 407a adjacent to the one surface 400a of the second printed circuit board 400, while a compression force may be applied onto other region of the via hole 407a adjacent to the other surface 400b. When the cross-sectional area of the via hole 407a adjacent to the one surface 400a of the second printed circuit board 400 is the same as the cross-sectional area of the via hole 407a adjacent to the other surface 400b, the via hole 407a may be subject to damage by tensile or compressive forces. According to an embodiment, the second printed circuit board 400 makes it possible to prevent and/or reduce the via hole 407a formed in the bending region 402 from being damaged by a compressive or tensile force, since the cross-sectional areas of the via hole 407a formed in the bending region 402 are different from each other in between the one surface 400a and the other surface 400b of the second printed circuit board 400. As the via hole 407a formed in the bending region 402 can be then prevented/reduced from being damaged, a plurality of via holes 407 may be formed in the second printed circuit board 400 irrespectively of the extending region 401 and the bending region 402, so that a via fence may be formed by the plurality of via holes 407 in the entire area of the second printed circuit board 400.

As described above, the second printed circuit board 400 according to an embodiment has different cross-sectional areas of the via hole 407a formed in the bending region 402, in between an area adjacent to one surface 400a and other area adjacent to the other surface 400b of the second printed circuit board 400, thereby significantly increasing durability in the bending region 402. Therefore, the second printed circuit board 400 makes it possible to have a plurality of via holes 407 form a via fence irrespectively of the extending region 401 and the bending region 402, thereby enabling to keep a signal transmission via the signal line 405 much more smooth. For example, when the second printed circuit board 400 is disposed adjacent to an antenna array (e.g., an antenna array 240 of FIG. 2B), electromagnetic waves radiated from the antenna array 240 may interfere with signal transmission or reception in the second printed circuit board 400. If the signal transmission to/from the second printed circuit board 400 is interrupted, the electronic device (e.g., an electronic device 101 of FIGS. 2A and 2B) may be unable to provide the user with a pre-designed function in a smooth and seamless manner. According to an embodiment, in the second printed circuit board 400, a plurality of via holes 407 may be disposed without omission in both the extending region 401 and the bending region 402 in which the signal line 405 is formed, so that it can prevent and/or reduce unnecessary electromagnetic waves from penetrating into the signal line 405.

FIG. 4A is a cross-sectional view illustrating at least a portion of an example structure taken along a line A-A' of FIG. 3 of an extending region and a bending region of a second printed circuit board according to an embodiment, and FIG. 4B is a cross-sectional view illustrating at least a portion of an example structure taken along line B-B' of FIG. 3 of a bending region of the second printed circuit board according to various embodiments.

Referring now to FIGS. 4A and 4B, in an embodiment, the second printed circuit board 400 may include a first coverlay 410, a first adhesive layer 420 disposed on the first coverlay 410, a first conductive layer 430 disposed on the first adhesive layer 420, a non-conductive layer 440 disposed on the first conductive layer 430, a second conductive layer 450 disposed on the non-conductive layer 440, a second adhesive layer 460 disposed on the second conductive layer 450, and a second coverlay 470 disposed on the second adhesive layer 460. According to an embodiment, the first conductive layer 430 and the second conductive layer 450 may form a ground line (e.g., a ground line 406 of FIG. 3) for the second printed circuit board 400.

According to an embodiment, a plurality of layers 410, 420, 430, 440, 450, 460, and 470 of the second printed circuit board 400 in the bending region 402 may be bent with a certain curvature. According to an embodiment, the plurality of layers 410, 420, 430, 440, 450, 460, and 470 may have a curvature that decreases as it approaches further from the other surface 400b to the one surface 400a of the second printed circuit board 400. For example, the second coverlay 470 may have a smaller curvature than the second adhesive layer 460, the second adhesive layer 460 may have a smaller curvature than the second conductive layer 450, the second conductive layer 450 may have a smaller curvature than the non-conductive layer 440, the non-conductive layer 440 may have a smaller curvature than the first conductive layer 430, the first conductive layer 430 may have a smaller curvature than the first adhesive layer 420, and the first adhesive layer 420 may have a smaller curvature than the first coverlay 410.

According to an embodiment, the non-conductive layer 440 may function to electrically separate the first conductive layer 430 and the second conductive layer 450 from each other. The non-conductive layer 440 may denote a layer through which no current flows in case where a voltage less than a breakdown voltage is applied. The non-conductive layer 440 may be interposed between the first conductive layer 430 and the second conductive layer 450. For example, the first conductive layer 430 may be disposed on one surface of the non-conductive layer 440, and the second conductive layer 450 may be disposed on the other surface facing the one surface of the non-conductive layer 440 on which the first conductive layer 430 is disposed.

According to an embodiment, the non-conductive layer 440 may include a coupling layer 441, a first insulating layer 442, and a second insulating layer 443. The coupling layer 441 may include a plastically deformable material to maintain the shape of the bending region 402. The first insulating layer 442 may be interposed between the coupling layer 441 and the first conductive layer 430. The second insulating layer 443 may be interposed between the coupling layer 441 and the second conductive layer 450. For example, the first insulating layer 442 and the second insulating layer 443 may be made of a polyimide material.

According to an embodiment, the second printed circuit board 400 may further include via holes 480 penetrating the first conductive layer 430, the non-conductive layer 440, and the second conductive layer 450. These via holes 480 of FIGS. 4A and/or 4B may be substantially the same as the plurality of via holes 407 of FIG. 3. According to an embodiment, these via holes 480 may be divided into via holes 481 disposed in the extension area 401 and via holes 482 disposed in the bending region 402. According to an embodiment, a plurality of via holes 480 may be disposed to be spaced apart from each other. As the plurality of via holes 480 are disposed to be spaced apart from each other, the second printed circuit board 400 may be formed in such a manner that a region in which the via holes 480 are formed and its neighboring region in which no via holes 480 are formed are repeated in turn. Since the region in which the via holes 480 are formed has relatively more flexibility while the region in which no via hole 480 are formed has relatively more rigidity, the overall durability of the second printed circuit board 400 can be increased. According to an embodiment, the via hole 480 may be of a conductive hole drilled to electrically connect the ground line 406 of different conductive layers. The via hole 480 may include, for example, a plated through hole (PTH), a laser via hole (LVH), a buried via hole (BVH), or a stacked via.

According to an embodiment, the second printed circuit board 400 may include a slot-shaped conductive structure (not shown) in addition to the via holes 480. For example, the slot may be formed to have a relatively large area compared to at least one via hole 480, and may be formed in substantially the same or similar manner to a boring method of forming the at least one via hole 480. According to an embodiment, the second printed circuit board 400 has a structure strong against compressive and/or tensile forces generated in the via hole 482 owing to the slot-shaped conductive structure formed in the bending region 402, thereby enhancing its durability.

According to an embodiment, in the extending region 401, a cross-sectional area of the via hole 481 in contact with the first conductive layer 430 and a cross-sectional area of the via hole 481 in contact with the second conductive layer 450 may be formed to be substantially the same as each other.

According to an embodiment, in the bending region 402, a cross-sectional area of the via hole 482 in contact with the first conductive layer 430 and a cross-sectional area of the via hole 482 in contact with the second conductive layer 450 may be different from each other. For example, the cross-sectional area of the via hole 482 in contact with the first conductive layer 430 may be smaller than the cross-sectional area of the via hole 482 in contact with the second conductive layer 450. According to an embodiment, in the bending region 402, the cross-sectional area of the via hole 482 may further increase as it approaches from the first conductive layer 430 to the second conductive layer 450. A curvature of the first conductive layer 430 in the bending region 402 may be less than a curvature of the second conductive layer 450. Depending on the difference in curvature between the first conductive layer 430 and the second conductive layer 450, a compressive force may be applied to one region of the via hole 482 in contact with the first conductive layer 430, and a tensile force may be applied to the other region of the via hole 482 in contact with the second conductive layer 450. In the bending region 402, when the cross-sectional area of the via hole 482 in contact with the first conductive layer 430 is the same as the cross-sectional area of the via hole 482 in contact with the second conductive layer 450, the via hole 482 may be damaged by such tensile or compressive forces. According to an embodiment, in the second printed circuit board 400, the cross-sectional areas of the via hole 482 formed in the bending region 402 are different from each other in between the first conductive layer 430 and the second conductive layer 450, and therefore, it is possible to prevent and/or reduce the via hole 482 of the bending region 402 from being damaged by the compressive or tensile force.

According to an embodiment, the at least one via hole 480 may be formed by drilling at least one region of the second printed circuit board 400, but it is not limited thereto. According to an embodiment, the at least one via hole 480 may be formed through laser processing or punching processing. After the via hole 480 is formed, the shape of the at least one via hole 482 may be deformed using an external force onto the bending region 402. For example, the cross-sectional areas of the first conductive layer 430 and the second conductive layer 450 through which at least one via hole 482 is formed may be made up to be different from each other, so that the shape of the via hole 482 is polygonal (e.g., trapezoidal).

According to an embodiment, the second printed circuit board 400 may further include a conductive member 480a disposed inside the via hole 480. The conductive member 480a may electrically connect the first conductive layer 430 and the second conductive layer 450 to each other. For example, the conductive member 480a may extend from the first conductive layer 430 to the second conductive layer 450 along the inner surface of the via hole 480, so as to electrically connect the first conductive layer 430 and the second conductive layer 450.

According to an embodiment, the inside of the via holes 480 may be filled with a conductive material, and the conductive material may include at least one of, for example, copper, silver paste, aluminum, silver-aluminum, carbon paste, or carbon nanotube (CNT) paste, but is not limited thereto.

According to an embodiment, the shape of the cross-section of the via hole 482 in the bending region 402 may be different from the shape of the cross-section of the via hole 481 in the extending region 401. For example, a cross-sectional area in contact with the first conductive layer 430 of the via hole 482 located in the bending region 402 may be smaller than a cross-sectional area in contact with the first conductive layer 430 of the via hole 481 located in the extending region 401. As another example, the cross-sectional area in contact with the second conductive layer 450 of the via hole 482 positioned in the bending region 402 may be larger than the cross-sectional area in contact with the first conductive layer 430 of the via hole 481 located in the extending region 401.

According to an embodiment, the bending region 402 may have different curvatures depending on positions. For example, the bending region 402 may have the curvature that changes depending on the positions in a path extending toward the extending region 401. As the bending region 402 has a varying curvature, the via holes 482 formed in the bending region 402 may have different shapes. For example, a first via hole 482a and a second via hole 482b adjacent to each other may be formed in the bending region 402. Since the bending region 402 has a variable curvature, the shape of the first via hole 482a and the shape of the second via hole 482b positioned in the bending region 402 may be different from each other. A difference between the cross-sectional area in contact with the first conductive layer 430 and the cross-sectional area in contact with the second conductive layer 450 in the first via hole 482a may be greater than a difference between the cross-sectional area in contact with the first conductive layer 430 and the cross-sectional area in contact with the second conductive layer 450 in the second via hole 482b.

According to an embodiment, the shape of the conductive member 480a disposed in the via hole 482 in the bending region 402 may be different from the shape of the conductive member 480a disposed in the via hole 481 in the extending region 401. For example, a thickness of the conductive member 480a of the via hole 482 formed in the bending region 402 may be larger than a thickness of the conductive member 480a of the via hole 481 formed in the extending region 401. Since the thickness of the conductive member 480a is larger in the bending region 402 than in the extending region 401, the second printed circuit board 400 can secure the elongation in the bending region 402, as well as secure the structure strong against compressive and/or tensile forces acting in the region 402.

As described above, in the second printed circuit board 400 according to an embodiment, the cross-sectional areas of the via holes 482 formed in the bending region 402 are different in between the first conductive layer 430 and the second conductive layer 450, so that one region of the via hole 482 in contact with the first conductive layer 430 can be provided with the structure strong against the compressive force, while the other region of the via hole 482 in contact with the second conductive layer 450 can be provided with the structure strong against the tensile force. As the via hole 482 of the bending region 402 has the structure strong against both the compressive and tensile forces, durability of the second printed circuit board 400 can be increased. According to an embodiment, the second printed circuit board 400 can provide increased durability owing to the structure of repeating in turn a region having relatively more flexibility and its neighboring region having relatively more rigidity in the bending region 402.

According to an embodiment, the second printed circuit board 400 can provide improved durability in the bending region 402, thereby preventing/reducing damage that may occur in the via hole 482 or the periphery of the via hole 482. Since the via holes 480 can be formed in the entire area of the second printed circuit board 400 without damage in the bending region 402, it is possible to prevent and/or reduce occurrence of interference between signals transmitted through the second printed circuit board 400 and any external signals.

According to an embodiment, the second printed circuit board 400 may include a substrate laminated with a polymer material for a shape molding on at least some layers of the extending region 401 and the bending region 402, the substrate being bonded with the corresponding material. Further, the second printed circuit board 400 may include a substrate of a composite structure using an elastic dielectric for securing flexibility, a plastic dielectric for maintaining shape, and/or an additional material (e.g., gold, hardening ink) for inducing elastic deformation and plastic deformation.

Figure 5A:
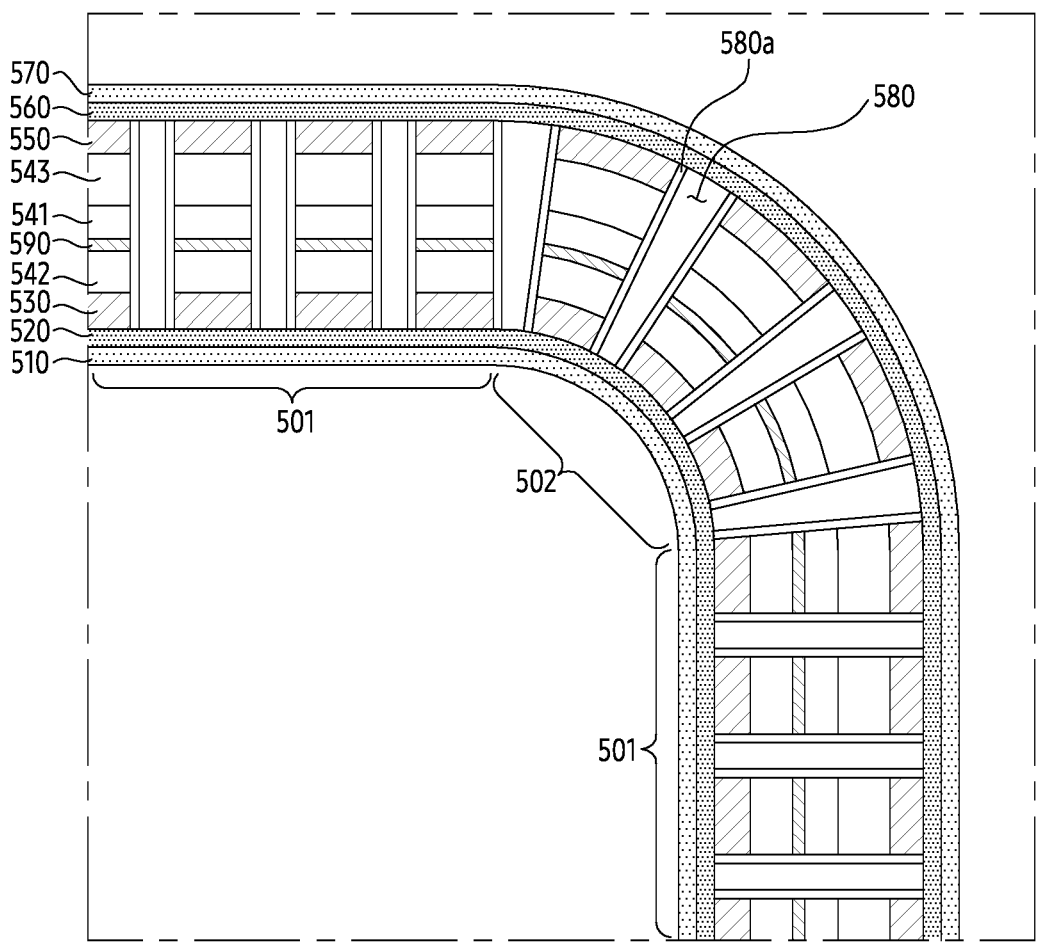
FIG. 5A is a cross-sectional view illustrating an example of an extending region and a bending region of a second printed circuit board according to an embodiment.
Figure 5B:
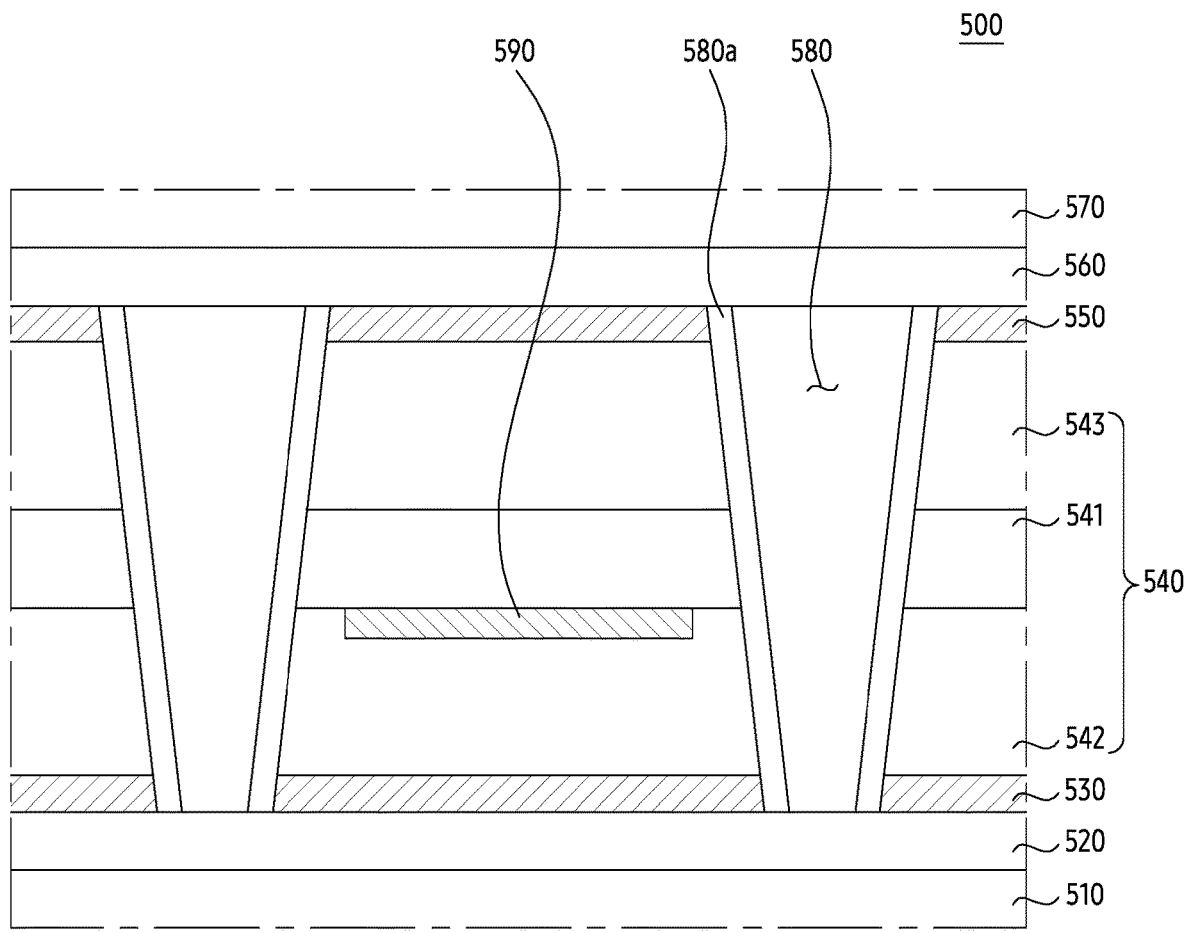
FIG. 5B is a cross-sectional view illustrating an example of a bending region of a second printed circuit board according to an embodiment.

FIG. 5A is a cross-sectional view illustrating an example of an extending region and a bending region of a second printed circuit board 500 according to an embodiment, and FIG. 5B is a cross-sectional view illustrating an example of a bending region of the second printed circuit board according to an embodiment.

The second printed circuit board 500 of FIGS. 5A and/or 5B may be the second printed circuit board 500 with a signal pattern 590 added to the second printed circuit board 400 shown in FIGS. 4A and/or 4B, and thus, any overlapping description may not be repeated here for convenience of explanation.

Referring now to FIGS. 5A and 5B, in an embodiment, the second printed circuit board 500 may include a first coverlay 510, a first adhesive layer 520 disposed on the first coverlay 510, a first conductive layer 530 disposed on the first adhesive layer 520, a non-conductive layer 540 disposed on the first conductive layer 530, a second conductive layer 550 disposed on the non-conductive layer 540, a second adhesive layer 560 disposed on the second conductive layer 550, a second coverlay 570 disposed on the second adhesive layer 560, and at least one via hole 580 running through the first conductive layer 530, the non-conductive layer 540 and the second conductive layer 550.

According to an embodiment, the second printed circuit board 500 may include an extending region 501 extending in one direction and a bending region 502 that is bent with respect to the extending region 501 to have a certain curvature. The extending region 501 and the bending region 502 of FIGS. 5A and/or 5B may be substantially the same as the extending region 401 and the bending region 402 of FIGS. 4A and/or 4B, and thus overlapping descriptions may not be repeated here for convenience of explanation.

According to an embodiment, the first conductive layer 530 and the second conductive layer 550 may form a ground line (e.g., a ground line 406 of FIG. 3) of the second printed circuit board 500.

According to an embodiment, the non-conductive layer 540 may include a coupling layer 541, a first insulating layer 542, and a second insulating layer 543. The coupling layer 541 may include a plastically deformable material to maintain the shape of the bending region 502. The first insulating layer 542 may be interposed between the coupling layer 541 and the first conductive layer 530. The second insulating layer 543 may be interposed between the coupling layer 541 and the second conductive layer 550. For example, the first insulating layer 542 and the second insulating layer 543 may be made of a polyimide material.

According to an embodiment, the second printed circuit board 500 may further include a signal pattern 590. The signal pattern 590 may refer to a conductive pattern through which a current flows when a voltage less than a predetermined (e.g., specified) breakdown voltage is applied thereto. The signal pattern 590 may form a signal line (e.g., a signal line 405 of FIG. 3) of the second printed circuit board 500. The signal pattern 590 may be interposed between the first conductive layer 530 and the second conductive layer 550. The signal pattern 590 may be covered by the non-conductive layer 540. For example, the signal pattern 590 may be interposed between the first insulating layer 542 and the coupling layer 541.

According to an embodiment, the second printed circuit board 500 may further include a conductive member 580a disposed inside the via hole 580. The conductive member 580a may electrically connect the first conductive layer 530 and the second conductive layer 550 to each other. The via hole 580 and the conductive member 580a may be disposed to surround the signal pattern 590, thereby implementing a coaxial cable in the second printed circuit board 500.

As described above, in the second printed circuit board 500 according to an embodiment, cross-sectional areas of the via hole 580 formed in the bending region 502 are different in between the first conductive layer 530 and the second conductive layer 550, thereby providing increased durability in the bending region 502. According to an embodiment, in the second printed circuit board 500, a coaxial cable can be formed over the entire area respectively of the extending region 501 and the bending region 502, and therefore, it is possible to prevent and/or reduce signal transmission or reception via the signal pattern 590 from being disturbed by unnecessary electromagnetic waves.

Figure 6:
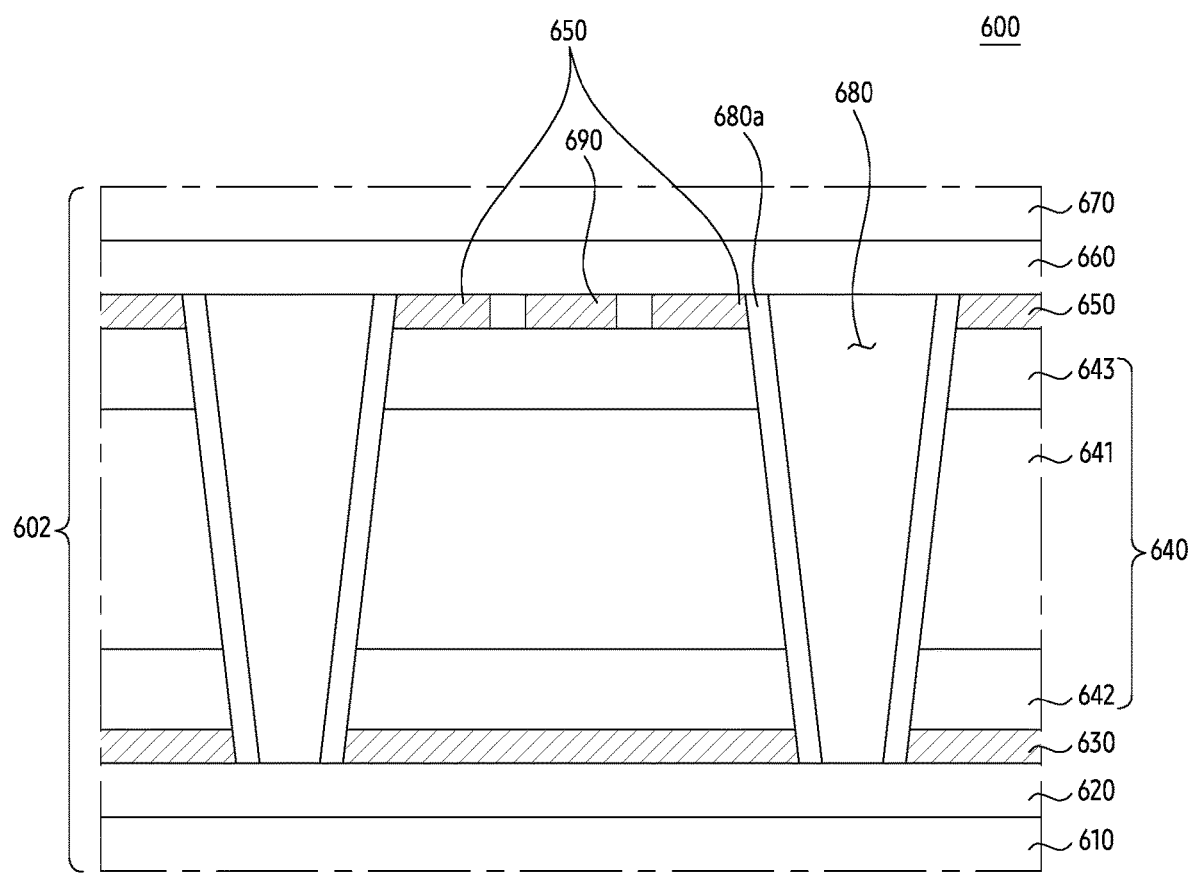
FIG. 6 is a cross-sectional view illustrating an example of a bending region of a second printed circuit board according to an embodiment.

FIG. 6 is a cross-sectional view illustrating an example of a bending region of a second printed circuit board 600 according to an embodiment.

The second printed circuit board 600 of FIG. 6 may be a second printed circuit board 600 in which a signal pattern 690 is added to the second printed circuit board 400 of FIGS. 4A and/or 4B, so any redundant description may not be repeated here.

Referring now to FIG. 6, in an embodiment, the second printed circuit board 600 may include a first coverlay 610, a first adhesive layer 620 disposed on the first coverlay 610, a first conductive layer 630 disposed on the first adhesive layer 620, a non-conductive layer 640 disposed on the first conductive layer 630, a second conductive layer 650 disposed on the non-conductive layer 640, a second adhesive layer 660 disposed on the second conductive layer 650, a second coverlay 670 disposed on the second adhesive layer 660, and a via hole 680 penetrating the first conductive layer 630, the non-conductive layer 640 and the second conductive layer 650. According to an embodiment, the second printed circuit board 600 may include a bending region 602 that is bent to have a curvature. The bending region 602 of FIG. 6 may be substantially the same as the bending region 402 of FIGS. 4A and/or 4B, and thus, any overlapping descriptions may not be repeated here.

According to an embodiment, the first conductive layer 630 and the second conductive layer 650 may form a ground line (e.g., a ground line 406 of FIG. 3) of the second printed circuit board 600.

According to an embodiment, the non-conductive layer 640 may further include a coupling layer 641, a first insulating layer 642, and a second insulating layer 643. The coupling layer 641 may include a plastically deformable material to retain the shape of the bending region 602. The first insulating layer 642 may be interposed between the coupling layer 641 and the first conductive layer 630. Further, the second insulating layer 643 may be interposed between the coupling layer 641 and the second conductive layer 650. For example, the first insulating layer 642 and the second insulating layer 643 may be made of a polyimide material.

According to an embodiment, the second printed circuit board 600 may further include a signal pattern 690. The signal pattern 690 may refer to a conductive pattern through which a current flows when a voltage less than a predetermined breakdown voltage is applied. The signal pattern 690 may make up a signal line (e.g., a signal line 405 of FIG. 3) of the second printed circuit board 600. The signal pattern 690 may be configured to be electrically separated from the first conductive layer 630 and the second conductive layer 650. According to an embodiment, the signal pattern 690 may be disposed on the other surface of the non-conductive layer 640 facing one surface of the non-conductive layer 640 on which the first conductive layer 630 is disposed, so as to be substantially parallel to the second conductive layer 650. For example, the signal pattern 690 may be disposed on the second insulating layer 643 of the non-conductive layer 640.

According to an embodiment, the second printed circuit board 600 may further include a conductive member 680a disposed inside the via hole 680. The conductive member 680a may electrically connect the first conductive layer 630 and the second conductive layer 650 to each other. The via hole 680 and the conductive member 680a may be disposed to surround the signal pattern 690, thereby enabling to implement a coaxial cable in the second printed circuit board 600.

As described above, in the second printed circuit board 600 according to an embodiment, the cross-sectional areas of the via hole 680 formed in the bending region 602 are different from each other in between the first conductive layer 630 and the second conductive layer 650, thereby providing enhanced durability in the bending region 602.

Figure 7A:
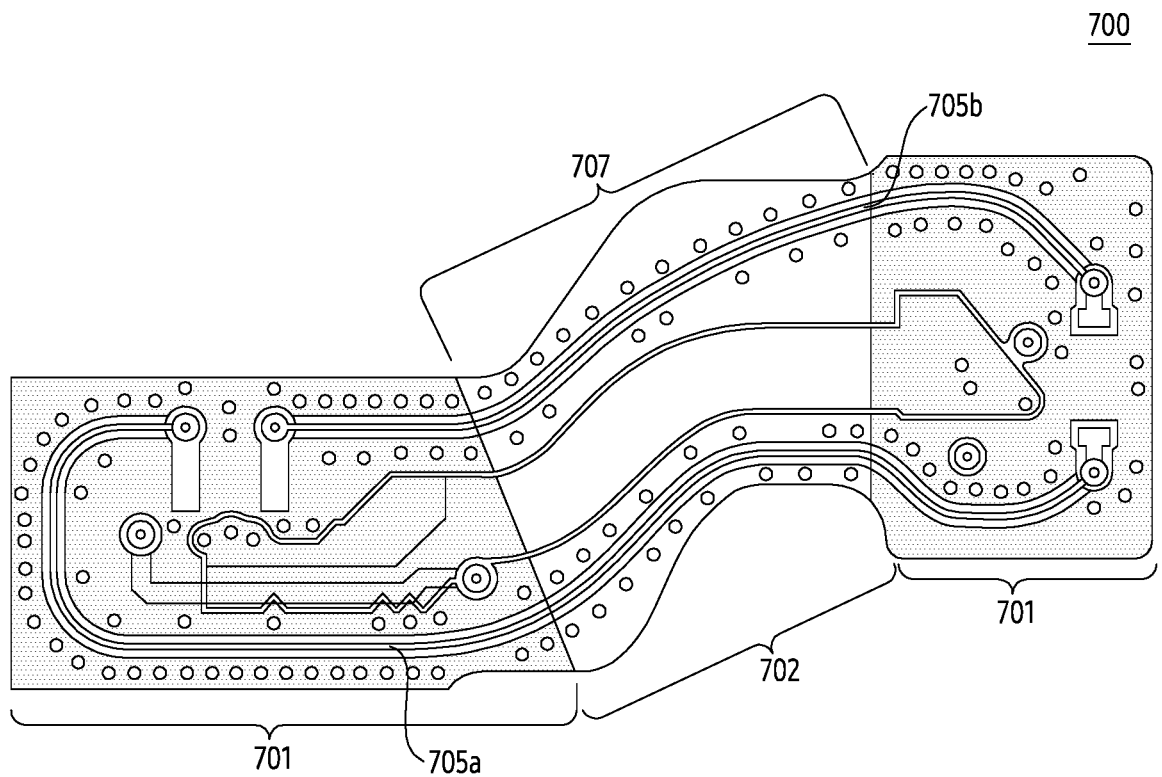
FIGS. 7A and 7B are diagrams illustrating examples in which via holes are formed in a second printed circuit board.
Figure 7B:
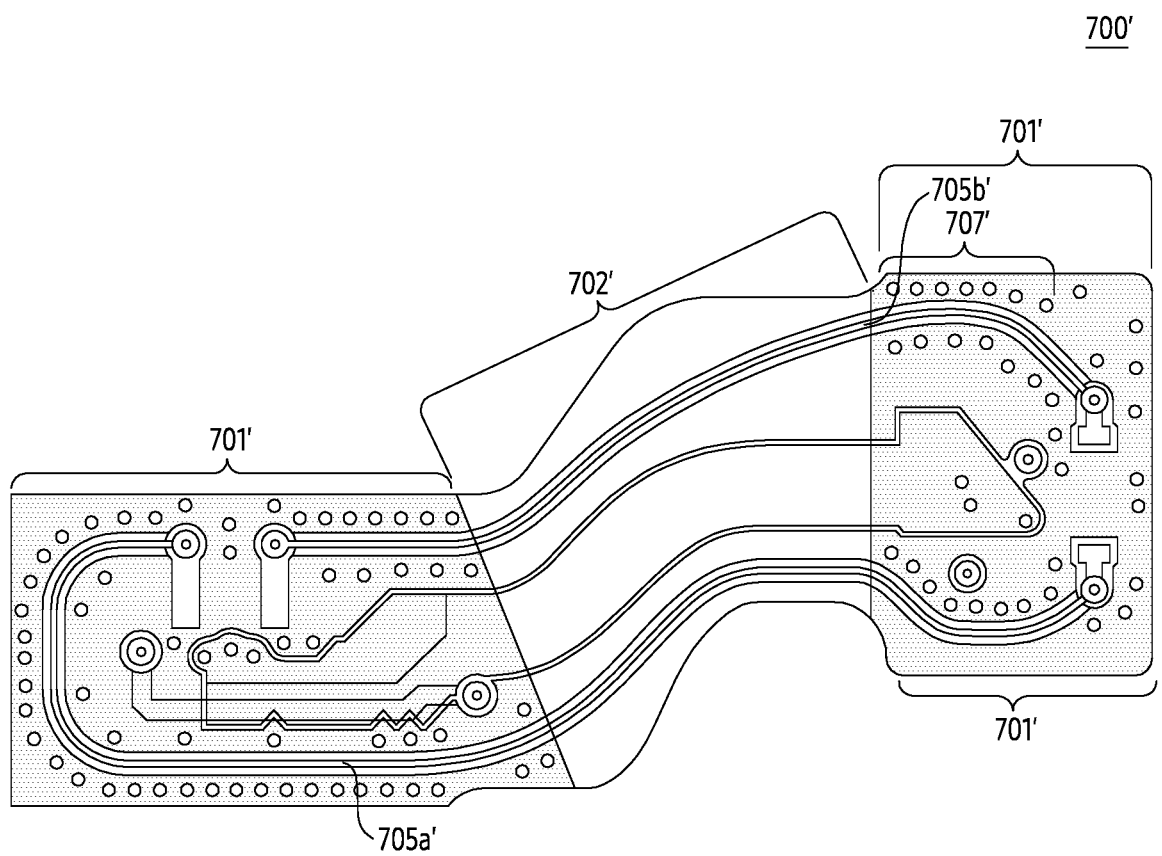
Figure 7C:
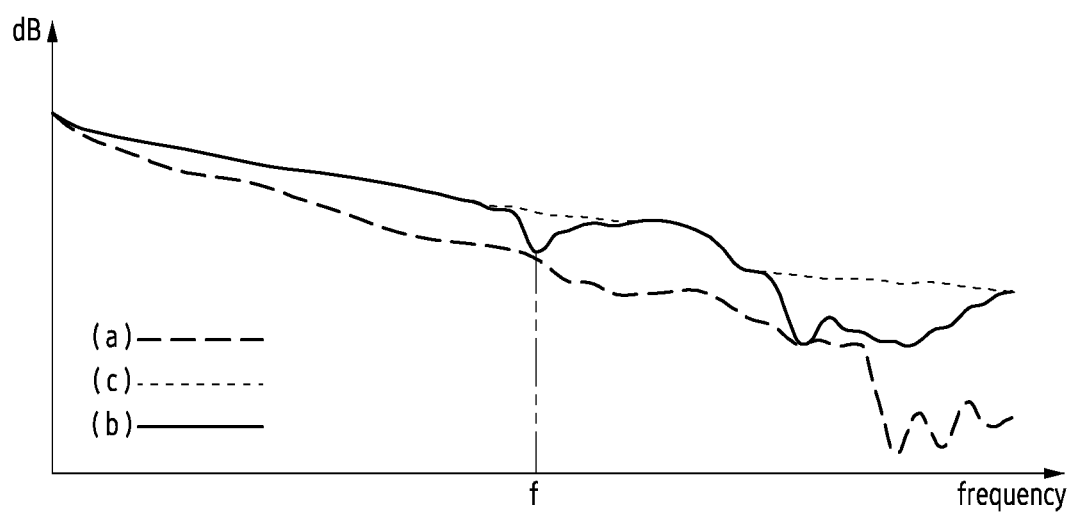
FIG. 7C is a graph illustrating a relationship between signal loss and frequency of signal lines in a second printed circuit board.

FIGS. 7A and 7B are diagrams each illustrating an example in which via holes are formed in a second printed circuit board, and FIG. 7C is a graph illustrating a relationship between signal loss and frequency of signal lines in the second printed circuit board.

In greater detail, FIG. 7A illustrates an example of the second printed circuit board 700 in which a plurality of via holes 707 are formed in the bending region 702, and FIG. 7B illustrates an example of the second printed circuit board 700' in which no via holes 707' are formed in the bending region 702'.

Referring to FIG. 7A, in an embodiment, the second printed circuit board 700 may include a first signal line 705a and a second signal line 705b disposed in an extending region 701 and a bending region 702. In an embodiment, the plurality of via holes 707 may be disposed to surround the first signal line 705a and the second signal line 705b in the extending region 701 and the bending region 702. The plurality of via holes 707 may be arranged to form at least one via fence.

Referring to FIG. 7B, the second printed circuit board 700' according to a comparative example may include a first signal line 705a' and a second signal line 705b' disposed in an extension area 701' and a bending region 702'. In the comparative example, the plurality of via holes 707' may be arranged to surround the first signal line 705a' and the second signal line 705b' only in the extending region 701' other than the bending region 702'. The plurality of via holes 707' may be arranged to form at least one via fence.

Referring then to FIG. 7C, the graph (a) shows the relationship between the frequency and the signal loss of the first signal lines 705a and 705a', the graph (b) shows the relationship between the frequency and the signal loss in the second signal line 705b' of the second printed circuit board 700' according to the comparative example, and the graph (c) shows the relationship between the frequency and the signal loss in the second signal line 705b of the second printed circuit board 700 according to an embodiment.

In the graph (a), a length of the path in which the first signal line 705a of FIG. 7A passes through the bending region 702 may be shorter than a length of the path in which the second signal line 705b of FIG. 7A passes through the bending region 702. Thus, as the length of the path in the bending region 702 is shorter, no resonance may occur in the first signal line 705a of FIG. 7A. A length of the path in which the first signal line 705a' of FIG. 7B passes through the bending region 702' may be shorter than a length of the path in which the second signal line 705b' of FIG. 7B passes through the bending region 702'. Thus, as the length of the path in the bending region 702' is shorter, no resonance may occur in the first signal line 705a' of FIG. 7B.

In the graph (b), a length of the path in which the second signal line 705b' of FIG. 7B passes through the bending region 702' may be longer than a length of the path in which the first signal line 705a' passes through the bending region 702'. Thus, when the plurality of via holes 707' are not formed in the bending region 702', a gap corresponding to the length of the bending region 702' may be caused between a plurality of via holes 707'. When such a gap is caused to occur between the plurality of via holes 707, the plurality of via holes 707' may not form any via fence in the bending region 702', so when a signal in a specific frequency band f passes through the signal line 705b', a resonance may occur.

In the graph (c), a length of the path in which the second signal line 705b of FIG. 7A passes through the bending region 702 may be greater than a length of the path in which the first signal line 705a passes through the bending region 702. In case of the second printed circuit board 700 of FIG. 7A, a plurality of via holes 707 form a via fence in the bending region 702, and thus, when a signal of a specific frequency band f passes through the second signal line 705b, no resonance may occur.

As apparent from the foregoing, the second printed circuit board 700 according to an embodiment makes it possible to have a plurality of via-holes 707 arranged without omission in both the extending region 701 and the bending region 702, thereby preventing/reducing occurrence of resonance when a signal in a specific frequency band f passes through the second signal line 705b.

According to an example embodiment, a printed circuit board (e.g., a second printed circuit board 400 of FIG. 2B) comprises: an extending region extending in one direction (e.g., an extending region 401 of FIG. 3) and a bending region (e.g., a bending region 402 of FIG. 3) bent with respect to the extending region. The extending region and the bending region further include: a non-conductive layer (e.g., a non-conductive layer 440 of FIGS. 4A and 4B), a first conductive layer disposed on one surface of the non-conductive layer (e.g., a first conductive layer 430 of FIGS. 4A and 4B), a second conductive layer (e.g., a non-conductive layer 450 of FIGS. 4A and 4B) disposed on another side of the non-conductive layer, and via holes (e.g., via holes 480 of FIGS. 4A and 4B) penetrating the first conductive layer and the second conductive layer. Further, in the bending region, a cross-sectional area of the via hole in contact with the first conductive layer may be less than a cross-sectional area of the via hole in contact with the second conductive layer.

According to an example embodiment, a cross-sectional area of the via holes in the bending region may increase as it approaches further from the first conductive layer to the second conductive layer.

According to an example embodiment, a cross-sectional area of the via hole in contact with the first conductive layer in the bending region may be less than a cross-sectional area of the via hole in contact with the first conductive layer in the extending region, and a cross-sectional area of the via hole in contact with the second conductive layer in the bending region may be greater than a cross-sectional area of the via hole in contact with the second conductive layer in the extending region.

According to an example embodiment, the printed circuit board may further comprise: a conductive member (e.g., a conductive member 480a of FIGS. 4A and 4B) comprising a conductive material extending from the first conductive layer to the second conductive layer along an inner surface of the via hole to electrically connect the first conductive layer and the second conductive layer.

According to an example embodiment, the printed circuit board may further comprise: a signal pattern (e.g., a signal pattern 690 of FIG. 6) disposed on the other surface of the non-conductive layer parallel to the second conductive layer, and electrically separated from the second conductive layer.

According to an example embodiment, the printed circuit board may further comprise: a signal pattern (e.g., a signal pattern 590 of FIGS. 5A and 5B) interposed between the first conductive layer and the second conductive layer, and the non-conductive layer may be configured to cover the signal pattern.

According to an example embodiment, the bending region may further comprise: a plurality of the via holes, and a difference between a cross-sectional area in contact with the first conductive layer in one via hole of the plurality of the via holes in the bending region and a cross-sectional area of the one via hole in contact with the second conductive layer may be greater than a difference between a cross-sectional area in contact with the first conductive layer in another via hole of the plurality of the via holes and a cross-sectional area of the another via hole in contact with the second conductive layer.

According to an example embodiment, an electronic device (e.g., an electronic device 101 of FIGS. 2A and 2B) comprises: a first printed circuit board (e.g., a first printed circuit board 300 of FIG. 2B) and a second printed circuit board (e.g., a second printed circuit board 400 of FIG. 2B) including: an extending region (e.g., an extending region 401 of FIG. 3) connected to the first printed circuit board and a bending region (e.g., a bending region 402 of FIG. 3) bending with respect to the extending region. The extending region and the bending region may include a non-conductive layer (e.g., a non-conductive layer 440 of FIGS. 4A and 4B), a first conductive layer (e.g., a first conductive layer 430 of FIGS. 4A and 4B) disposed on one surface of the non-conductive layer, a second conductive layer (e.g., a non-conductive layer 450 of FIGS. 4A and 4B) disposed on another surface of the non-conductive layer, and via holes (e.g., via holes 480 of FIGS. 4A and 4B) penetrating the non-conductive layer, the first conductive layer and the second conductive layer. Further, in the bending region, a cross-sectional area of a via hole in contact with the first conductive layer may be less than a cross-sectional area of the via hole in contact with the second conductive layer.

According to an embodiment, a cross-sectional area of the via hole in the bending region may increase as it approaches further from the first conductive layer to the second conductive layer.

According to an example embodiment, a cross-sectional area of the via hole in contact with the first conductive layer in the bending region may be less than a cross-sectional area of the via hole in contact with the first conductive layer in the extending region, and a cross-sectional area of the via hole in contact with the second conductive layer in the bending region may be greater than a cross-sectional area of the via hole in contact with the second conductive layer in the extending region.

According to an example embodiment, the printed circuit board may further comprise: a conductive member (e.g., a conductive member 480a of FIGS. 4A and 4B) comprising a conductive material extending from the first conductive layer to the second conductive layer along an inner surface of the via hole to electrically connecting the first conductive layer and the second conductive layer.

According to an embodiment, the printed circuit board may further comprise: a signal pattern (e.g., a signal pattern 690 of FIG. 6) disposed on the other surface of the non-conductive layer to be parallel to the second conductive layer, and electrically separated from the second conductive layer.

According to an example embodiment, the printed circuit board further comprises: a signal pattern (e.g., the signal pattern 590 in FIGS. 5A and 5B) interposed between the first conductive layer and the second conductive layer, and the non-conductive layer may be configured to cover the signal pattern.

According to an example embodiment, the bending region comprises: a plurality of the via holes, and a difference between a cross-sectional area in contact with the first conductive layer in one via hole of the plurality of the via holes in the bending region and a cross-sectional area of the one via hole in contact with the second conductive layer may be greater than a difference between a cross-sectional area in contact with the first conductive layer of another via hole of the plurality of the via holes and a cross-sectional area of the another via hole in contact with the second conductive layer.

According to an example embodiment, a printed circuit board (e.g., a second printed circuit board 400 of FIG. 3) comprises: a first coverlay (e.g., a first coverlay 410 of FIGS. 4A and 4B), a first adhesive layer disposed on the first coverlay (e.g., a first adhesive layer 420 of FIGS. 4A and 4B), a first conductive layer (e.g., a first conductive layer 430 of FIGS. 4A and 4B) disposed on the first adhesive layer, a non-conductive layer (e.g., a non-conductive layer 440 of FIGS. 4A and 4B) disposed on the first conductive layer, a second conductive layer (e.g., a second conductive layer 450 of FIGS. 4A and 4B) disposed on the non-conductive layer, a second adhesive layer (e.g., a second adhesive layer 460 of FIGS. 4A and 4B) disposed on the second conductive layer, a second coverlay (e.g., a second coverlay 470 of FIGS. 4A and 4B) disposed on the non-conductive layer, and a plurality of via holes (e.g., via holes 480 of FIGS. 4A and 4B) penetrating the first conductive layer, the non-conductive layer, and the second conductive layer. Further, a cross-sectional area of a region of the via hole disposed in a bending region (e.g., a bending region 402 of FIG. 3) in contact with the first conductive layer among the plurality of via holes may be different from a cross-sectional area of a region of the via hole disposed in the bending region in contact with the second conductive layer.

According to an example embodiment, the printed circuit board may further comprise: a plurality of conductive members (e.g., a conductive member 480a of FIGS. 4A and 4B) comprising a conductive material electrically connecting the first conductive layer and the second conductive layer, the plurality of conductive members being disposed inside each of the plurality of via holes and extending from the first conductive layer to the second conductive layer along an inner surface of each of the plurality of via holes.

According to an embodiment, a cross-sectional area of the via hole disposed in the bending region of the plurality of the via holes may increase as it approaches further from the first conductive layer to the second conductive layer.

According to an example embodiment, the printed circuit board may further comprise: an extending region connected to the bending region and extending in one direction (e.g., an extending region 401 of FIG. 3), wherein a cross-sectional area of a via hole in contact with the first conductive layer in the bending region of the plurality of via holes may be less than a cross-sectional area of the via hole in contact with the first conductive layer in the extending region, and a cross-sectional area of the via hole in contact with the second conductive layer in the bending region of the plurality of the via holes may be greater than a cross-sectional area of the via hole in contact with the second conductive layer in the extending region.

According to an example embodiment, the printed circuit board may further comprise: a signal pattern (e.g., a signal pattern 690 of FIG. 6) interposed between the first conductive layer and the second conductive layer, and the non-conductive layer may be configured to cover the signal pattern.

According to an example embodiment, a difference between a cross-sectional area in contact with the first conductive layer in one via hole disposed in the bending region of the plurality of the via holes and a cross-sectional area of the one via hole in contact with the second conductive layer may be greater than a difference between a cross-sectional area of another via hole in contact with the first conductive layer disposed in the bending region and a cross-sectional area of the another via hole in contact with the second conductive layer.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A printed circuit board comprising:
   an extending region extending along one direction; and
   a bending region configured to bend with respect to the extending region;
   wherein the extending region and the bending region comprises:
   a non-conductive layer;
   a first conductive layer disposed on one surface of the non-conductive layer;
   a second conductive layer disposed on the other surface of the non-conductive layer; and
   at least one via hole penetrating the non-conductive layer, the first conductive layer, and the second conductive layer, and
   wherein, in the bending region, a cross-sectional area of the via hole in contact with the first conductive layer is less than a cross-sectional area of the via hole in contact with the second conductive layer.

2. The printed circuit board of claim 1, wherein the cross-sectional area of the via hole in the bending region increases as it approaches further from the first conductive layer to the second conductive layer.

3. The printed circuit board of claim 1, wherein the cross-sectional area of the via hole in the bending region in contact with the first conductive layer is less than the cross-sectional area of the via hole in the extending region in contact with the first conductive layer, and
   wherein the cross-sectional area of the via hole in the bending region in contact with the second conductive layer is greater than the cross-sectional area of the via hole in the extending region in contact with the second conductive layer.

4. The printed circuit board of claim 1, further comprising a conductive member comprising a conductive material extending from the first conductive layer to the second conductive layer along an inner surface of the via hole to electrically connect the first conductive layer and the second conductive layer.

5. The printed circuit board of claim 1, further comprising a signal pattern disposed on another surface of the non-conductive layer to be parallel to the second conductive layer, the signal pattern being electrically separated from the second conductive layer.

6. The printed circuit board of claim 1, further comprising a signal pattern interposed between the first conductive layer and the second conductive layer, the non-conductive layer being configured to cover the signal pattern.

7. The printed circuit board of claim 1, wherein the bending region comprises a plurality of the via holes, and wherein among the plurality of the via holes in the bending region, a difference between a cross-sectional area of one via hole in contact with the first conductive layer and the cross-sectional area of the one via hole in contact with the second conductive layer is greater than a difference between the cross-sectional area of another via hole in contact with the first conductive layer and the cross-sectional area of the another via hole in contact with the second conductive layer.

8. An electronic device comprising:
a first printed circuit board; and
a second printed circuit board comprising an extending region electrically connected to the first printed circuit board and a bending region configured to bend with respect to the extending region;
wherein the extending region and the bending region respectively comprises:
a non-conductive layer;
a first conductive layer disposed on one surface of the non-conductive layer;
a second conductive layer disposed on the other surface of the non-conductive layer; and
at least one via hole penetrating the non-conductive layer, the first conductive layer, and the second conductive layer, and
wherein, in the bending region, a cross-sectional area of the via hole in contact with the first conductive layer is less than a cross-sectional area of the via hole in contact with the second conductive layer.

9. The electronic device of claim 8, wherein the cross-sectional area of the via hole in the bending region increases as it approaches further from the first conductive layer to the second conductive layer.

10. The electronic device of claim 8, wherein the cross-sectional area of the via hole in the bending region in contact with the first conductive layer is less than the cross-sectional area of the via hole in the extending region in contact with the first conductive layer, and
wherein the cross-sectional area of the via hole in the bending region in contact with the second conductive layer is greater than the cross-sectional area of the via hole in the extending region in contact with the second conductive layer.

11. The electronic device of claim 8, further comprising a conductive member comprising a conductive material extending from the first conductive layer to the second conductive layer along an inner surface of the via hole to electrically connect the first conductive layer and the second conductive layer.

12. The electronic device of claim 8, further comprising a signal pattern disposed on another surface of the non-conductive layer to be parallel to the second conductive layer, the signal pattern being electrically separated from the second conductive layer.

13. The electronic device of claim 8, further comprising a signal pattern interposed between the first conductive layer and the second conductive layer, the non-conductive layer being configured to cover the signal pattern.

14. The electronic device of claim 8, wherein the bending region comprises a plurality of the via holes, and
wherein among the plurality of the via holes in the bending region, a difference between the cross-sectional area of one via hole in contact with the first conductive layer and the cross-sectional area of the one via hole in contact with the second conductive layer is greater than a difference between the cross-sectional area of another via hole in contact with the first conductive layer and the cross-sectional area of the another via hole in contact with the second conductive layer.

15. A printed circuit board comprising:
a first coverlay;
a first adhesive layer disposed on the first coverlay;
a first conductive layer disposed on the first adhesive layer;
a non-conductive layer disposed on the first conductive layer;
a second conductive layer disposed on the non-conductive layer;
a second adhesive layer disposed on the second conductive layer;
a second coverlay disposed on the second adhesive layer; and
a plurality of via holes penetrating the first conductive layer, the non-conductive layer, and the second conductive layer;
wherein, among the plurality of via holes, a cross-sectional area of a region of the via hole disposed in a bending region in contact with the first conductive layer is different from a cross-sectional area of a region of the via hole disposed in the bending region in contact with the second conductive layer.

16. The printed circuit board of claim 15, further comprising a plurality of conductive members disposed in each of the plurality of the via holes, and extending from the first conductive layer to the second conductive layer along an inner surface of each the plurality of via holes, to electrically connect the first conductive layer and the second conductive layer.

17. The printed circuit board of claim 15, wherein among the plurality of the via holes, the cross-sectional area of the via hole disposed in the bending region increases as it approaches further the first conductive layer to the second conductive layer.

18. The printed circuit board of claim 15, further comprising: an extending region connected to the bending region and extending along one direction,
wherein, among the plurality of the via holes, the cross-sectional area of the via hole in the bending region in contact with the first conductive layer is less than the cross-sectional area of the via hole in the extending region in contact with the first conductive layer, and
wherein, among the plurality of the via holes, the cross-sectional area of the via hole in the bending region in contact with the second conductive layer is greater than the cross-sectional area of the via hole in the extending region in contact with the second conductive layer.

19. The printed circuit board of claim 15, further comprising a signal pattern interposed between the first conductive layer and the second conductive layer, the non-conductive layer being configured to cover the signal pattern.

20. The printed circuit board of claim 15, wherein a difference between the cross-sectional area of a via hole in contact with the first conductive layer and the cross-sectional area of the via hole in contact with the second conductive layer disposed in the bending region among the plurality of the via holes is greater than a difference between the cross-sectional area of another via hole in contact with the first conductive layer and the cross-sectional area of the another via hole in contact with the second conductive layer.

* * * * *